US006369330B2

(12) United States Patent
Chou

(10) Patent No.: US 6,369,330 B2
(45) Date of Patent: *Apr. 9, 2002

(54) PRINTED CIRCUIT BOARD WITH PUSHBUTTON AND AIR CORRIDORS

(76) Inventor: Chin-Wen Chou, 7 Fl., No.233, Wu-Hsing Street, Hsin-I Dist., Taipei City (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/405,164

(22) Filed: Sep. 24, 1999

(51) Int. Cl.[7] .................................................. H05K 1/00

(52) U.S. Cl. ......................... 174/254; 174/258; 174/261

(58) Field of Search ................................. 174/254, 260, 174/261, 259; 361/750, 751, 749

(56) References Cited

U.S. PATENT DOCUMENTS 3,987,259 A * 10/1976 Larson
4,180,711 A * 12/1979 Hirata et al.
4,403,272 A * 9/1983 Larson et al.

* cited by examiner

*Primary Examiner*—Kamand Cuneo
(74) *Attorney, Agent, or Firm*—Bacon & Thomas, PLLC

(57) ABSTRACT

An improved structure of printed circuit board (PCB) under a pushbutton. The PCB includes a base layer and an insulation membrane, wherein conductive portions and corresponding contact portions are printed on the base layer and the insulation membrane respectively. Insulation portions are printed on each contact portion along its circumference without the need to apply glue on a corridor between every pair of the conductive portions in the base layer and the contact portions in the insulation membrane when combining the insulation membrane to the base layer by gluing or direct printing. By this arrangement, an air channel can be reserved for being applicable to various button groups or waterproof membrane PCBs.

5 Claims, 5 Drawing Sheets

PRINTED CIRCUIT BOARD WITH PUSHBUTTON AND AIR CORRIDORS

BACKGROUND OF THE INVENTION

1. Field of the Invention

This invention relates to an improved structure of printed circuit board (PCB) under pushbutton, more particularly, to a PCB, wherein a circuit pattern can be printed on an insulation membrane and a base layer with waterproof function to fit various button groups, and to lessen thickness of a keyboard when being assembled with other key parts.

2. Description of the Prior Art

A pushbutton or combination keyboard in large or small scale can be found almost everywhere in household electrical appliances, test instruments, computers, etc. for easy control operation.

A membrane printed circuit board (PCB) used in a personal computer or notebook computer is usually composed of an upper and a lower layer membrane and an insulation layer inserted therein. As there is no glue applied among those three layers, hence, a contact point in the upper and the lower layer membrane respectively will contact each other when a rubber body of pushbutton is pressed down to squeeze air. However, in case a water drop happens to go into a pushbutton, no sooner has the rubber body restored from the previous state of being pressed then moisture is drawn into and intrudes upon the inside membrane PCB under a pushbutton which is likely to cause a short-circuit problem. Further, in assembling a keyboard, the mentioned PCB is commonly laid firstly on the base layer made of a metallic material before anchoring other button components that inevitably increases thickness, weight, and cost of the keyboard.

Another kind of PCB contains an upper and a lower flexible layer membrane, wherein a plurality of conductive portions is printed on the upper layer membrane while a plurality of contact portions corresponding with above conductive portions is printed on the lower layer membrane; and, an insulation portion is printed on each contact portion. The upper and the lower layer membrane are glued to form a membrane PCB of this kind.

Such a membrane PCB is also waterproof, nevertheless, it's laid on a metallic base layer before anchoring other button components that inevitably increases thickness, weight, and cost of the keyboard as mentioned above.

SUMMARY OF THE INVENTION

The primary object of this invention is to eliminate abovesaid defects by printing a circuit pattern on an insulation membrane and a base layer directly to fit various button groups with waterproof function and reduce thickness of the keyboard and production cost after assembling with other button components.

Another object of this invention is to provide an insulation portion of a PCB circularly and radially to be disposed around a contact portion of an insulation membrane, or circularly disposed in geometrical shapes, such as a circle, square, etc.

A further object of this invention is to transfer an insulation portion on an insulation membrane to a base layer, so that, it requires printing a contact portion and a circuit pattern only when fabricating the insulation membrane.

To realize abovesaid objects, the PCB of this invention comprises a base layer and an insulation membrane, wherein a plurality of conductive portions and corresponding contact portions are printed on the base layer and the insulation membrane respectively; a plurality of insulation portions is printed on each contact portion along its circumference; and, no glue will be applied on a corridor between every pair of the conductive portions in the base layer and the contact portions in the insulation membrane when combining the insulation membrane to the base layer by gluing or direct printing. By this arrangement, an air channel can be reserved for being applicable to various button groups or waterproof membrane PCBs.

BRIEF DESCRIPTION OF THE DRAWINGS

For a better understanding to the present invention, together with further advantages or features thereof, at least one preferred embodiment will be elucidated below with reference to the annexed drawings in which.

DETAILED DESCRIPTION OF THE PREFERRED EMBODIMENT

Figure 1:
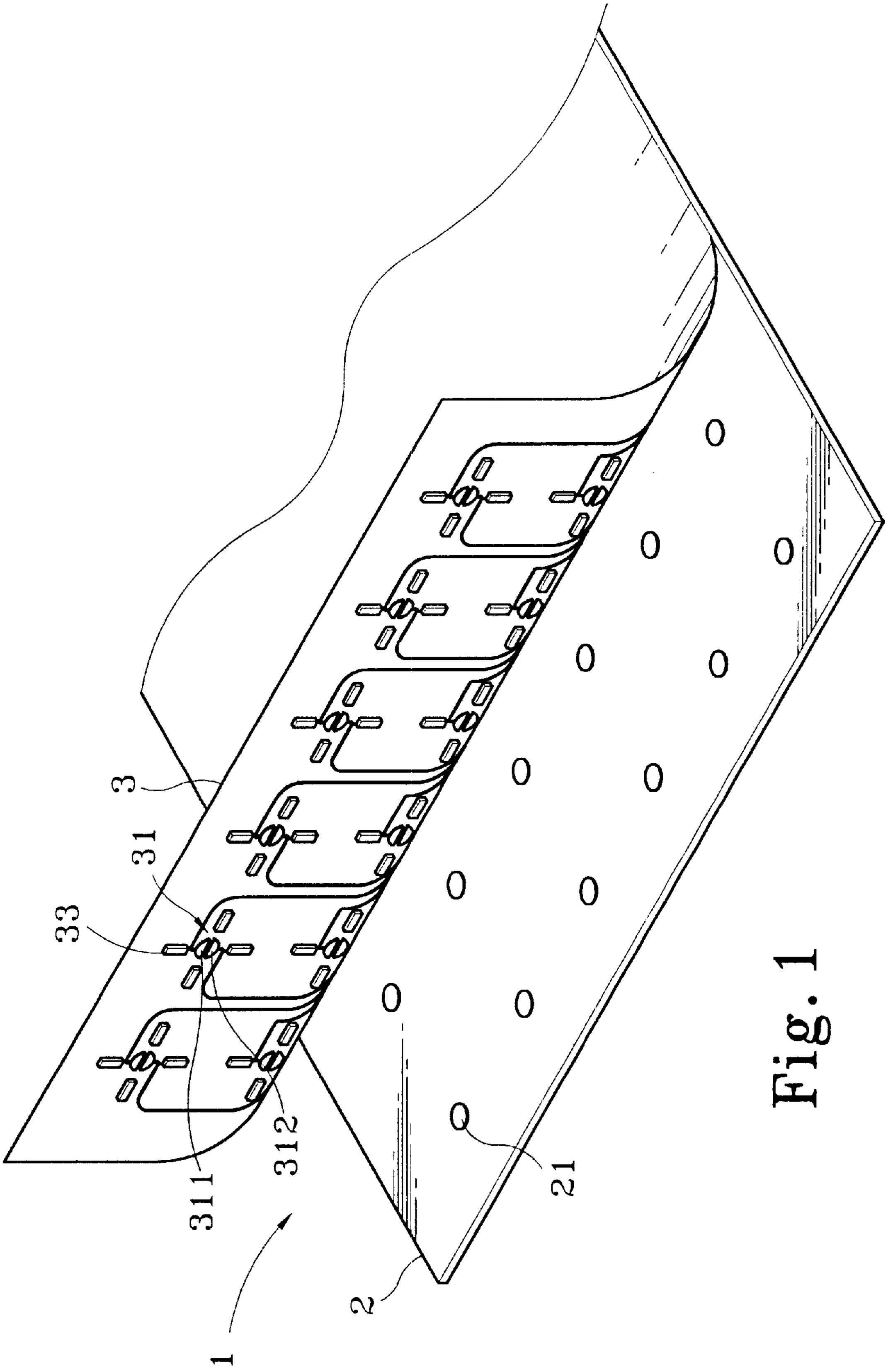
FIG. 1 is a three-dimension elevational view of a PCB of this invention.
Figure 2:
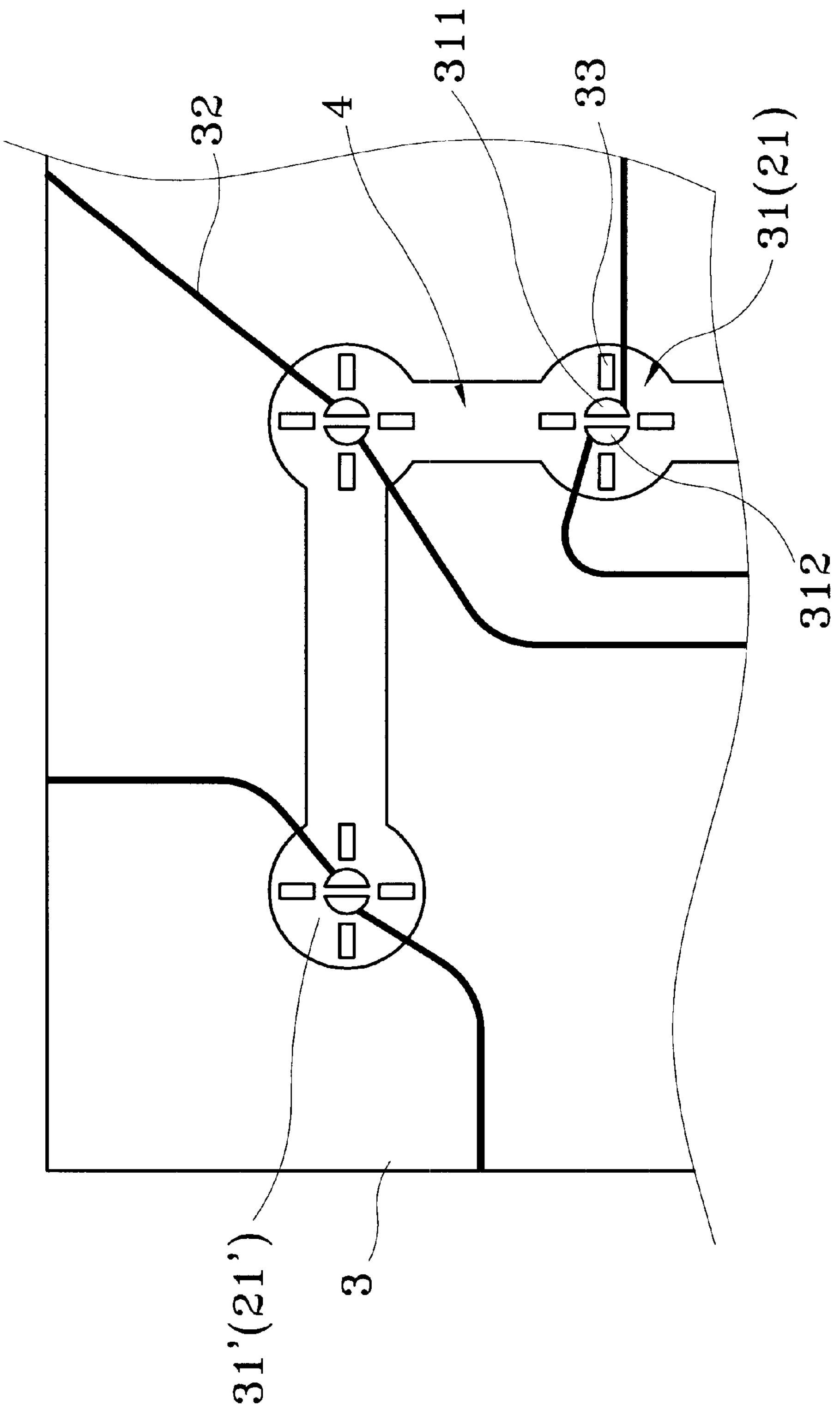
FIG. 2 is a schematic top view of the PCB of this invention.
Figure 3:
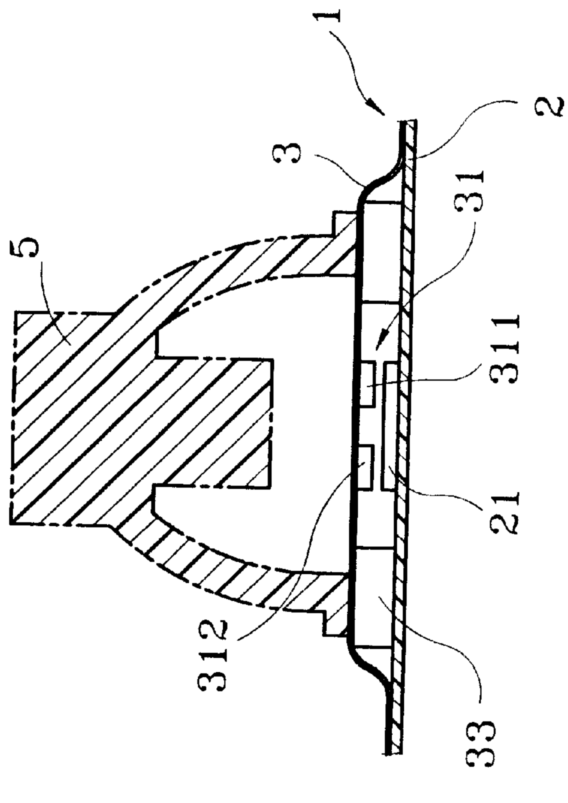
FIG. 3 is a vertical sectional view of the PCB of this invention.

As shown in FIGS. 1, 2, and 3, an improved structure of an inside printed circuit board (PCB) under a pushbutton of this invention—a waterproof membrane PCB 1 is applicable to various button groups—comprises a base layer 2 and an insulation membrane 3. The base layer 2 made of a hard plastic material (if a metallic material is used as in the prior art, an insulation layer must be printed on its surface to complicate the process) and the insulation membrane 3 is printed with a plurality of conductive portions 21 and corresponding contact portions 31 respectively. Each contact portion 31 is composed of a pair of contact-sections 311, 312, each coupled with a signal transmission line 32. A plurality of radially arranged insulation portions 33 is circularly printed on the contact portion 31 along its circumference. When the insulation membrane 3 is glue-combined with or printed directly on the base layer 2, a corridor between those two conductive portions 21, 21' in the base layer 2 and between those two contact portions 31, 31' in the insulation membrane 3 are reserved free of glue in order to form an air channel 4.

Figure 4:
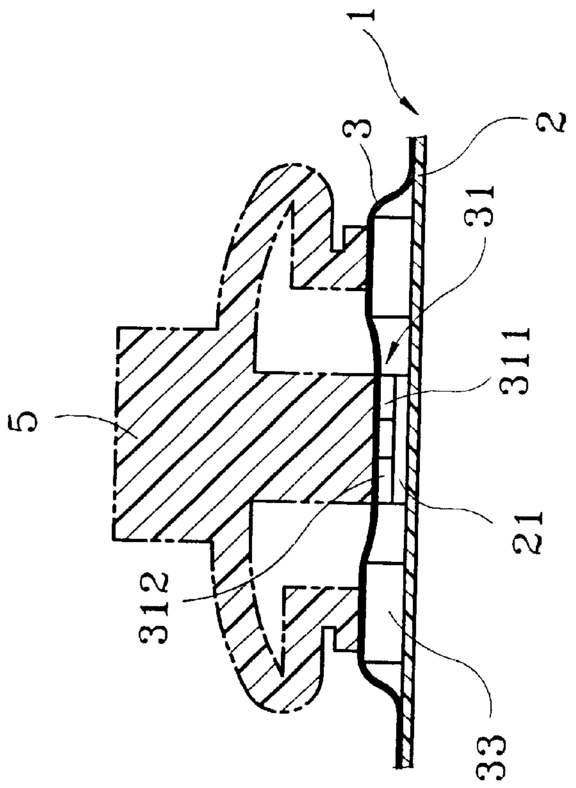
FIG. 4 illustrates action of FIG. 3.

Please refer to FIGS. 3 and 4—showing a vertical sectional and a schematic action view respectively, wherein a representative rubber body 5 is laid or glued on the insulation membrane 3 of the PCB 1. When the rubber body 5 is pressed down, the contact portion 31, of the insulation membrane 3 is forced to contact with the conductive portion 21 of the base layer 2, and an output signal of a pushbutton will be transmitted via the signal transmission line 32 of the contact-section 311, 312. Meanwhile, the air in the space between the conductive portion 21 and the contact portion 31 is squeezed and expelled to a neighboring space formed by another conductive portion 21' and contact portion 31' via the air channel 4, so that, moisture or water drops that may otherwise have been introduced down into a keyboard and drawn to and intrudes upon the membrane PCB 1 when a rubber body 5 is operated to cause a short-circuit can be prevented.

As mentioned above, a circuit pattern is printed on an insulation membrane 3 and a base layer 2 directly, thereby the thickness, weight, and cost of a completed PCB can be reduced. In addition, a waterproof PCB will ensure durability and a prolonged lifetime of a keyboard made according to the structure of this invention.

Figure 5:
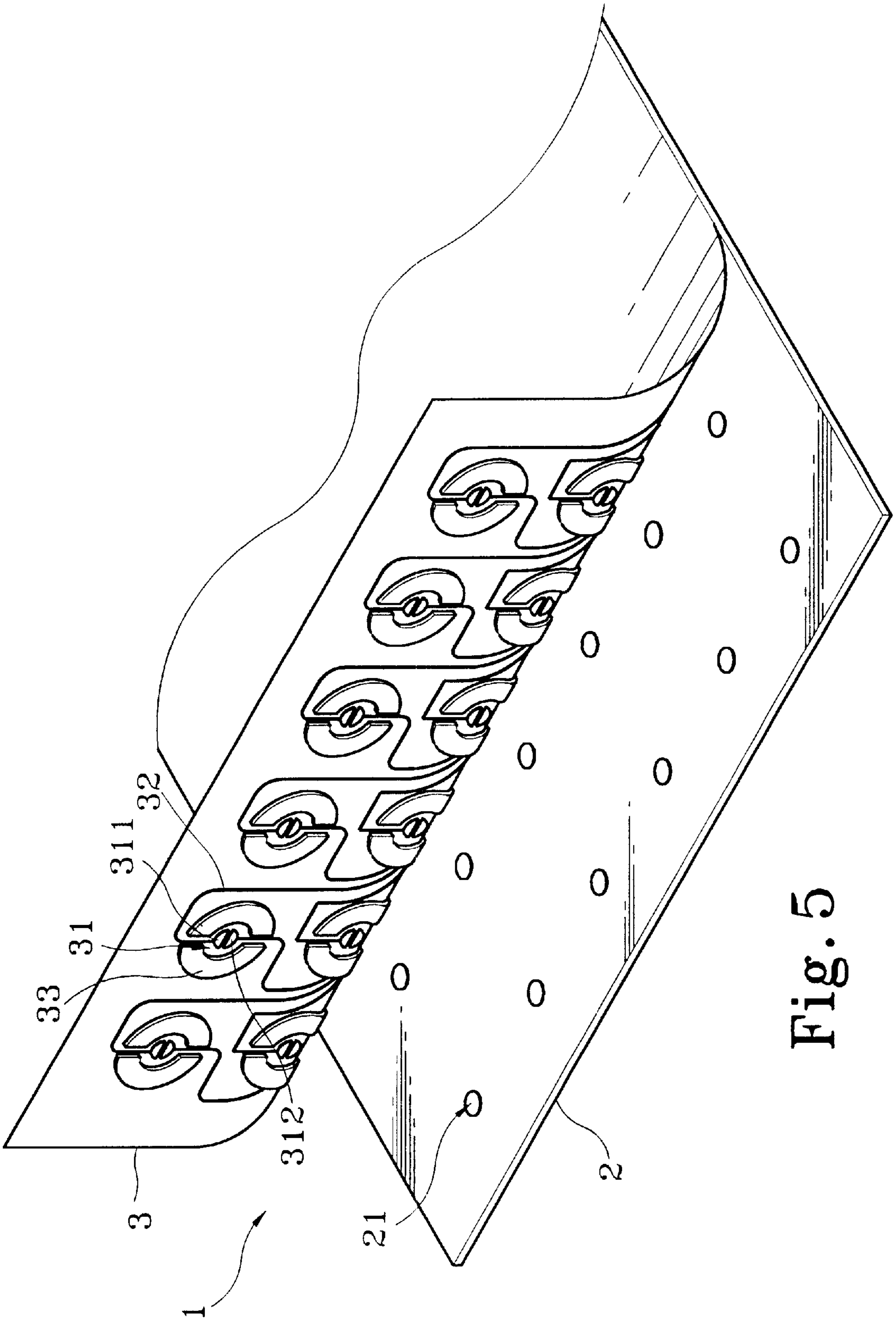
FIG. 5 is a schematic view of an embodiment of this invention.

As shown in FIG. 5, the foregoing radially arranged insulation portion 33 of the insulation membrane 3 might be formed in other geometrical shapes, such as a circle, a square, etc. for being printed on the contact portion 31 along its circumference.

Figure 6:
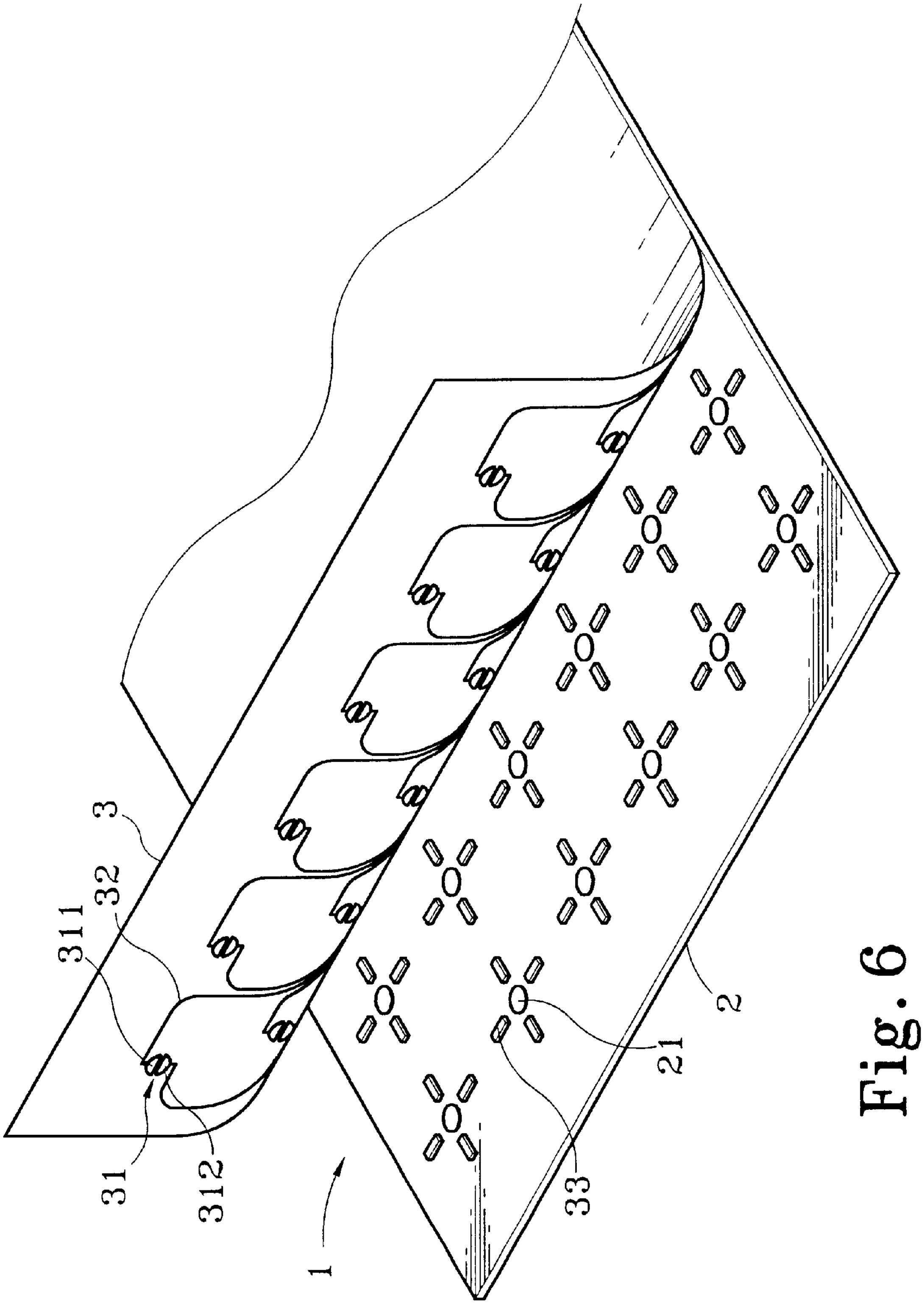
FIG. 6 is a schematic view of another embodiment of this invention.

Another embodiment of this invention shown in FIG. 6 is to transfer the insulation portion 33 of the insulation membrane 3 to the base layer 2, hence, only the contact portions 31, 31' and the signal transmission lines 32 are required to be printed on the insulation membrane 3.

Although, this invention has been described in terms of preferred embodiments, it is apparent that numerous variations and modifications may be made without departing from the true spirit and scope thereof, as set forth in the following claims.

What is claimed is:

1. An improved printed circuit board (PCB) for a keyboard, the PCB comprising:

a base layer having a plurality of conductive portions disposed thereon;

an insulation membrane comprising a plurality of spaced-apart contact portions disposed thereon, the contact portions each corresponds with a respective one of the conductive portions of the base layer when the insulation membrane is glued or printed to the base layer with the contact portions positioned apart and above the conductive portions, whereby the attachment of the insulation membrane with the base layer results in the PCB becoming substantially waterproof;

a plurality of insulation portions disposed around outer peripheries of each of the contact portions;

a plurality of signal transmission lines coupled with the contact portions;

wherein the adjacent pairs of the corresponding conductive portions and the contact portions are free of glue when the insulation membrane is glued with the base layer to form the air channels; and a plurality of corridors formed between the insulation membrane and the base layer, the corridors form air channels between adjacent pairs of the corresponding conductive portions and the contact portions, such that moisture or liquid accumulated between the base layer and the insulation membrane is directed away from an activated circuit formed by contacting one of the contact portions of the insulation membrane with a corresponding one of the conductive portions of the base layer.

2. The improved printed circuit board according to claim 1, wherein the base layer comprises a hard plastic material.

3. The improved printed circuit board according to claim 1, wherein each of the contact portions comprises at least two contact-sections.

4. The improved printed circuit board according to claim 1, wherein the insulation portions are disposed radially around each of the contact portions in geometrical shapes selected from the group consisting of a circle and a square.

5. The improved printed circuit board according to claim 1, wherein the insulation portions of the insulation membrane are secured to the base layer.

* * * * *